United States Patent [19]

Beinert et al.

[11] 4,028,058
[45] June 7, 1977

[54] DEVICE FOR MAKING MONOCRYSTALLINE GALLIUM ARSENIDE

[75] Inventors: Klaus Beinert; Herbert Weidner, both of Burghausen, Germany

[73] Assignee: Wacker-Chemitronic Gesellschaft fur Elektronik-Grundstoffe mbH, Burghausen, Germany

[22] Filed: Mar. 21, 1975

[21] Appl. No.: 560,744

[30] Foreign Application Priority Data

Apr. 30, 1974 Germany .................. 2420899

[52] U.S. Cl. .................. 23/273 SP; 156/617 SP
[51] Int. Cl.² ........................ B01J 17/18
[58] Field of Search ......... 156/617, 618; 23/305 R, 23/273 SP, 273 SPC

[56] References Cited

UNITED STATES PATENTS

| | | | |
|---|---|---|---|
| 3,154,384 | 10/1964 | Jones | 23/273 SP |
| 3,233,984 | 2/1966 | Erdman | 23/273 SP X |
| 3,305,485 | 2/1967 | Burmeister et al. | 156/617 |
| 3,488,157 | 1/1970 | Koffer | 23/273 SP |
| 3,493,770 | 2/1970 | Dessauer et al. | 23/273 SPC |
| 3,627,499 | 12/1971 | LeDuc et al. | 156/617 |
| 3,819,421 | 6/1974 | Merkel et al. | 156/617 |

OTHER PUBLICATIONS

Perry, "Chemical Engineers' Handbook", 4th Ed., pp. 3-96 (Table 3-141) (1963).

*Primary Examiner*—Jack Sofer
*Assistant Examiner*—Barry I. Hollander
*Attorney, Agent, or Firm*—Allison C. Collard

[57] ABSTRACT

Device for making monocrystalline gallium arsenide by drawing the crystal from a gallium arsenide-containing melt with adjustment of an arsenic vapor pressure while rotating and lifting the drawing means, said device comprising means for rotating the crucible containing an uncovered melt, and if desired, lifting or lowering the crucible independently of the system, that is to say without rotating the entire quartz apparatus. The means for rotating the crucible includes a ground-in joint formed by the core of the crucible driving shaft and a quartz glass sleeve. The core is made of a material having a higher coefficient of expansion than quartz glass at the operating temperature of the joint. The accurate seating of the ground-in joint avoids the formation of surface waves on the melt.

6 Claims, 1 Drawing Figure

U.S. Patent
June 7, 1977
4,028,058
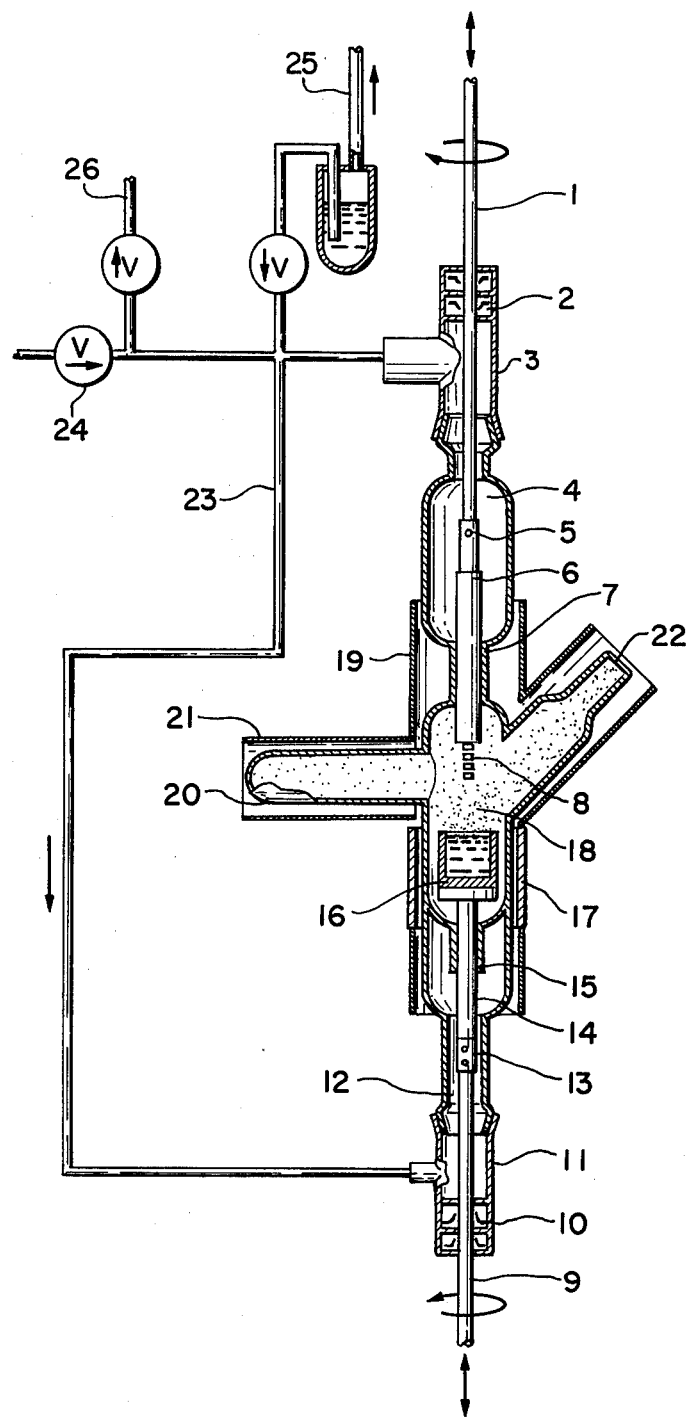

DEVICE FOR MAKING MONOCRYSTALLINE GALLIUM ARSENIDE

The present invention relates to a device for making monocrystalline gallium arsenide comprising novel means for carrying out a crucible drawing process.

Generally, monocrystalline gallium arsenide is made conventionally by known crucible drawing processes from a melt by use of a closed system, the growing crystal making a rotating movement with respect to the melt, the rotating movement in some cases being combined with a lifting movement.

Above the melt, the process requires that the vapor pressure of the more volatile component be maintained in order to avoid evaporation of arsenic and consequently a concentration of gallium in the melt. In order to prevent a condensation of arsenic from taking place, the entire reaction space has to be heated above the condensation temperature. It is thus difficult to transmit rotary and lifting movements into the interior of the reaction vessel.

There is one possibility of moving the seed crystal by magnetic means. Another known process uses a liquid seal with a bell of quartz being moved in a molten metal. Yet another known method consists of introducing the movement of the seed crystal into the interior of the vessel by means of a shaft of chemically and thermally resistant material, with the shaft forming a seal as gas tight as possible. However, with such a device, which cannot be lubricated, it is impossible to attain complete sealing. Other problems incurred by systems with liquid sealing of the shaft are due to the high temperatures applied, and the aggressiveness of the arsenic. Furthermore, a moving shaft is likely to be blocked by condensing substances.

An improvement is brought about by a process, in which the drawing and rotational movements of the seed crystals are introduced into the interior of the closed system by means of a KPG ground-in joint of quartz glass.

KPG stands for "Kuppers Patent Glas, " the name of the factory which first produced this ground-in-joint, which is now a common device in laboratories. The joint is, in that case, under a super-pressure of inert gas on the outside, in order to counteract the diffusion of arsenic from the interior of the reactor. To obtain flawless monocrystals of the highest quality, it is however, not sufficient to draw the crystal while rotating and lifting it, if it is not supplemented by a corresponding rotating and lifting movement of the crucible containing the melt.

Up to now, rotation and lifting of the crucible independently of the system, that is to say, a rotation without rotating the entire quartz apparatus, has only been feasable in crucible drawing processes with a liquid covering. In that process, the evaporation of arsenic from the melt is prevented by covering the melt with a liquid, for instance, liquid boron oxide. It is a drawback of this method, that the stoichiometric composition of the melt during the drawing of the crystal cannot be controlled and, if necessary, corrected. It is an additional disadvantage that by the contact of the melt covering with the growing crystal, the purity and uniform growth of the crystal are impaired.

It is the object of the present invention to provide a device for making monocrystalline gallium arsenide which avoids the above mentioned shortcomings of the known art.

It has now been found in accordance with the invention, that the production of a monocrystalline gallium arsenide by drawing a crystal from a melt containing gallium arsenide with adjustment of the arsenic vapor and with rotation and lifting of the drawing device can advantageously be accomplished by providing means for rotating and lifting the crucible containing the free melt independently of the system. By "free melt" an uncovered melt is to be understood. If desired, means are also provided for lowering the crucible independently of the system.

To carry out the invention, a device is preferred which comprises a quartz apparatus with a crucible therein for receiving the melt from which the crystals are to be drawn. The apparatus has mounted on the upper end, a drawing head with a drawing shaft and a seal. The apparatus is further equipped with a ground-in joint KPG between the drawing space and the attachment of the drawing head, with the sleeve of the joint being part of the quartz apparatus, and the core being part of the drawing shaft. According to the invention, there is a crucible head at the bottom of the quartz apparatus with a driving shaft of a material having a higher expansion coefficient than quartz, and a second ground-in joint KPG between the crucible and the crucible head whose sleeve is part of the quartz apparatus and whose core is part of the crucible driving shaft.

In the accompanying drawing, a device for carrying out the process of the invention is illustrated by way of example.

In the drawing, a metal shaft 1 is passed to an unheated chamber 4 through a vacuum-tight oil seal 2 (commercial name, "Simmering seal") of a drawing head 3. A quartz rod 6 is fastened to metal shaft 1 by means of a flexible coupling 5. Rod 6 is movable in a very tight-fitting sleeve 7. Rod 6 carries the seed crystal 8, which may be lifted and lowered while being rotated.

From the opposite side of the apparatus, a second metal shaft 9 is passed through a vacuum tight oil seal 10 of the crucible head 11 into an unheated chamber 12. A graphite rod 14 movable in a closely fitting sleeve 15 is fastened to the metal shaft 9 by a flexible coupling 13. Graphite rod 14 carries at the top a crucible 16 which contains the gallium arsenide melt. The rod may be lifted and lowered while being rotated. A high frequency coil 17 is used to heat crucible 16.

The reaction chamber proper is designated by 18; it is heated in its interior by a resistance heater 19; in a laterally extending portion of the chamber, a body 20 of arsenic is placed at the bottom, and by means of another resistance heater 21, a partial pressure of arsenic is adjusted, for instance, to 1 atm. in a manner known per se. The course of the crystal drawing can be observed by a transparent tube 22, which is likewise heated by resistance heater 19. In the unheated chambers 4 and 12, which are connected by a pressure equalization pipe 23, a partial pressure of an inert gas is adjusted to 0.9 –5 atm., preferably 1 –'atm., the inert gas being admitted through a pipe line 24, and withdrawn through a pipe line 25. A vacuum pipe line 26 is provided for evacuation of the entire apparatus during heating before the melting and crystal drawing proper is started.

The use of a ground-in joint KPG, consisting of a cylindrical quartz sleeve and a cylindrical quartz core is advantageous for the rotational as well as the lifting movement of the seed crystal, because of the low abrasion, and because of the smooth run, when accurately manufactured. However, when used for the driving of the crucible, surface waves are formed on the melt which impair the drawing of the crystal as far as quality and yield are concerned. In some cases, no practical results can be achieved at all. However, when a core is used in the joint having a higher expansion coefficient than the quartz sleeve, the seat of the ground-in joint will be accurate and the movement of the crucible becomes satisfactory.

The core material having a higher expansion coefficient than that of quartz must be fracture proof and as low in abrasion as possible. Particularly suited as a core material are graphite and boron nitride. A ground-in KPG joint can be made so tight that the loss in arsenic is determined almost entirely by the quartz ground-in KPG joint for crystal rotation and crystal lifting.

In another modification of the invention, it is preferable to make the drawing shaft from a material having a larger expansion coefficient than quartz. As mentioned before, it is particularly necessary to be sure that an abrasion-free material is used, otherwise, the abraded particles of the drawing shaft could drop into the free melt and could lead to impurities or undesirable doping of the monocrystals. The free melt has no covering sheet on the surface.

The inert gas to be used in the quartz apparatus between drawing head and KPG joint for prevention of arsenic losses may e.g. be argon or helium.

When, as described with reference to the drawing, a pressure equalization pipe 23 is used between chambers 4 and 12, arsenic loss by an effect comparable to chimney draft may be excluded.

According to a further embodiment of the invention, the two KPG joints can be equipped with a capillary ring with a diffusion path as described in Deutache Auslegeschrift 1,233,828.

It is especially advantageous to use in the apparatus according to the invention, the laterally extending portion or side arm for the supply of the more volatile component of the crystal, especially arsenic. By controlling the temperature in the lateral portion of chamber 18, the stoichiometric composition of the melt can be regulated even during the drawing of the crystal.

Whereas in the boat process, even comparatively low deviations from the stoichiometric composition of the melt lead to disturbances in the structure of the crystal, the crucible process lends itself to mono-crystalline drawing over a wider range than strictly stoichiometric composition. The risk of occlusions being formed is considerably lower since, for example, local accumulations of gallium drop to the bottom due to their higher density and will therefore not be built into the crystal. It is true that with increasing deviation of the composition of the melt from the stoichiometric composition, the rate of drawing has to be proportionally decreased.

In the process used with the device according to the invention, the surface of the melt is maintained during the entire crystal drawing operation at the same height as a temperature profile assigned at the outside; this is accomplished by moving the crucible to the level which corresponds to the one reached by withdrawal of material. In addition, an optimal symmetry of the temperature is reached in the melt by simultaneous rotation of the crucible, since in that manner, irregularities in the distance of the crucible from the heating coil and the quartz wall are compensated.

The quartz apparatus according to the invention is generally built up by an assembly jig, in order to make sure that the temperature in the entire system is equally and symmetrically distributed, that is to say, that the temperature profiles are symmetrical with respect to the axis. By assembly jig, it is understood that a set of normed parts are used, each comprising several component parts consisting, for example, of carbon, so that an accurate fit and melting together of the quartz apparatus is guaranteed.

In accordance with the invention, monocrystals of excellent quality can be drawn in high yields, having dislocation densities below 20,000 cm⁻at/a diameter of more than 20 mm; they can be drawn not only in the 111-plane, but with the use of appropriately grown seed crystals also in the preferred 100 plane. Circular gallium arsenide disks of 100-monocrystals are especially easy to polish and are best suited as polished disks in epitaxy, e.g. for making epitaxial disks in the production of light emitting diodes.

The invention will be more fully explained by the following example, but it should be understood that this is given by way of illustration only and not of limitation.

EXAMPLE 200 g gallium are filled into the graphite crucible described above and 250 g arsenic are filled into the side arm. After the crucible has been coupled in the opened apparatus with the crucible-driving shaft, the quartz apparatus, having been built up and fitted together by the assembly jig is melted together and placed between drawing head and crucible head, whereupon the joints of the heads are pressed together firmly by springs. The drawing rod with seed crystal was at this time still above the KPG joint. The apparatus was then completely heated through in vacuo and an argon excess pressure of 1 atm. was established by way of the admission pipe for the inert gas. Subsequently, the quartz rod carrying the seed crystal was inserted into the upper KPG joint, the temperature of the arsenic source raised to 620° C, gallium melted by the induction coil and saturated with arsenic. When saturation was complete, the seed crystal was dipped into the melt and the crystal drawn while the crucible was rotated, being moved at the same time to follow the drop of the melt surface. After three hours, a round monocrystal was obtained having over the entire length an almost even rod diameter of about 30 mm and a weight of 250 g. The monocrystal had a plane doping profile transverse to the rod axis.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. A device for making monocrystalline gallium arsenide by drawing a crystal from a gallium arsenide containing melt, comprising a quartz apparatus, a crucible in said apparatus for receiving the melt in an uncovered state, means for drawing the crystal, means for rotating and lifting or lowering said drawing means, means for rotating and lifting or lowering the crucible without rotating the entire quartz apparatus, said crucible having a driving shaft passing through ground-in joint, said joint comprising the core of said shaft and a quartz glass sleeve, said core being made from a material having a higher coefficient of expansion than quartz glass at the operating temperature of said joint and which is fracture proof and low in abrasion at the operating temperature of said joint said shaft carrying coupling means to said crucible to allow rotation of the crucible.

2. The device for making monocrystalline gallium arsenide according to claim 1, said device comprising a drawing head with drawing shaft and sealing means between said drawing shaft and said drawing head at the top end of the quartz apparatus, a ground-in joint between the drawing space and attachment of the drawing head, said joint comprising the core of said drawing shaft and a quartz glass sleeve said sleeve being part of the quartz apparatus, said drawing shaft being made of a material having a higher coefficient of expansion than said quartz glass at the operating temperature of said joint and which is fracture proof and low in abrasion. at the operating temperature of said joint.

3. The device according to claim 1 wherein said driving shaft core is made from a material selected from the group consisting of boron nitride and graphite.

4. The device according to claim 2 wherein the material having a higher expansion coefficient than quartz is a member of the group consisting of boron nitride and graphite.

5. The device according to claim 2 wherein a laterally extending part is provided in the quartz apparatus, said part being capable of receiving a source for arsenic.

6. The device according to claim 2 further including a crucible head at the bottom of said quartz apparatus through which said driving shaft passes, and an inert gas line connecting said crucible head to said drawing head.

* * * * *